(12) United States Patent
Kohl et al.

(10) Patent No.: US 7,868,445 B2
(45) Date of Patent: Jan. 11, 2011

(54) INTEGRATED STRUCTURES AND METHODS OF FABRICATION THEREOF WITH FAN-OUT METALLIZATION ON A CHIPS-FIRST CHIP LAYER

(75) Inventors: James E. Kohl, Reading, MA (US); Charles W. Eichelberger, Wakefield, MA (US)

(73) Assignee: EPIC Technologies, Inc., Woburn, MA (US)

( * ) Notice: Subject to any disclaimer, the term of this patent is extended or adjusted under 35 U.S.C. 154(b) by 200 days.

(21) Appl. No.: 12/144,840

(22) Filed: Jun. 24, 2008

(65) Prior Publication Data
US 2008/0315391 A1    Dec. 25, 2008

Related U.S. Application Data

(60) Provisional application No. 60/945,988, filed on Jun. 25, 2007.

(51) Int. Cl.
*H01L 23/48* (2006.01)
(52) U.S. Cl. .................. 257/690; 257/E23.141
(58) Field of Classification Search ............... 257/690, 257/737, 778, 724
See application file for complete search history.

(56) References Cited

U.S. PATENT DOCUMENTS

| | | | |
|---|---|---|---|
| 4,783,695 A | 11/1988 | Eichelberger et al. |
| 5,250,843 A | 10/1993 | Eichelberger |
| 5,353,498 A | 10/1994 | Fillion et al. |
| 5,841,193 A | 11/1998 | Eichelberger |
| 5,998,859 A | 12/1999 | Griswold et al. |
| 6,064,114 A | 5/2000 | Higgins, III |
| 6,159,767 A | 12/2000 | Eichelberger |
| 6,426,545 B1 | 7/2002 | Eichelberger et al. |
| 6,507,115 B1 | 1/2003 | Hofstee et al. |
| 6,555,908 B1 | 4/2003 | Eichelberger et al. |
| 6,586,827 B2 | 7/2003 | Takeuchi et al. |
| 6,818,544 B2 | 11/2004 | Eichelberger et al. |
| 6,838,776 B2 | 1/2005 | Leal et al. |

(Continued)

OTHER PUBLICATIONS

Office Action from U.S. Appl. No. 12/144,717 (U.S. Patent Publication No. 2008/0315404 A1), dated Jan. 8, 2010.

(Continued)

*Primary Examiner*—Nathan W Ha
(74) *Attorney, Agent, or Firm*—Kevin P. Radigan, Esq.; Heslin Rothenberg Farley & Mesiti P.C.

(57) ABSTRACT

Electronic modules and methods of fabrication are provided implementing a first metallization level directly on a chips-first chip layer. The chips-first layer includes chips, each with a pad mask over an upper surface and openings to expose chip contact pads. Structural dielectric material surrounds and physically contacts the side surfaces of the chips, and has an upper surface which is parallel to an upper surface of the chips. A metallization layer is disposed over the front surface of the chips-first layer, residing at least partially on the pad masks of the chips, and extending over one or more edges of the chips. Together, the pad masks of the chips, and the structural dielectric material electrically isolate the metallization layer from the edges of the chips, and from one or more electrical structures of the chips in the chips-first layer.

22 Claims, 12 Drawing Sheets

U.S. PATENT DOCUMENTS

| | | | |
|---|---|---|---|
| 6,972,964 | B2 | 12/2005 | Ho et al. |
| 7,006,359 | B2 | 2/2006 | Galvagni et al. |
| 7,112,467 | B2 | 9/2006 | Eichelberger et al. |
| 7,122,467 | B2 | 10/2006 | Lee et al. |
| 7,238,602 | B2 * | 7/2007 | Yang .......... 438/613 |
| 7,339,279 | B2 * | 3/2008 | Yang .......... 257/778 |
| 7,345,365 | B2 * | 3/2008 | Lee et al. .......... 257/724 |
| 7,405,102 | B2 | 7/2008 | Lee et al. |
| 7,427,812 | B2 * | 9/2008 | Wakisaka et al. .......... 257/786 |
| 7,429,793 | B2 * | 9/2008 | Yamagata .......... 257/723 |
| 7,550,830 | B2 * | 6/2009 | Yoon .......... 257/678 |
| 7,550,833 | B2 * | 6/2009 | Mihara .......... 257/686 |
| 7,572,681 | B1 * | 8/2009 | Huemoeller et al. .......... 438/125 |
| 7,619,901 | B2 | 11/2009 | Eichelberger et al. |
| 2003/0197285 | A1 * | 10/2003 | Strandberg et al. .......... 257/778 |
| 2003/0201534 | A1 * | 10/2003 | Eichelberger et al. .......... 257/737 |
| 2005/0062147 | A1 * | 3/2005 | Wakisaka et al. .......... 257/712 |
| 2005/0161799 | A1 * | 7/2005 | Jobetto .......... 257/690 |
| 2006/0017155 | A1 | 1/2006 | Wang |
| 2007/0249102 | A1 | 10/2007 | Brunnbauer et al. |
| 2008/0315375 | A1 | 12/2008 | Eichelberger et al. |
| 2008/0315377 | A1 | 12/2008 | Eichelberger et al. |
| 2008/0315404 | A1 | 12/2008 | Eichelberger et al. |

OTHER PUBLICATIONS

Office Action from U.S. Appl. No. 12/144,720 (U.S. Patent Publication No. 2008/0315375), dated Nov. 19, 2009.
"Wire Bond and Beyond: Semiconductor Packaging Innovation", White Paper, Freescale Semiconductor, Inc. Jul. 2006,pp. 1-9.
Leung, John, "Packaging Technology for Mobile Platforms", Wireless and Mobile Systems Group, Freescale Semiconductor, Inc., printed from Internet on Nov. 18, 2006, pp. 1-28.
Mangrum, Marc, "Packaging Technologies for Mobile Platforms", Wireless Mobile Systems Group, Freescale Semiconductor, Inc., Sep. 28, 2006, pp. 1-19.
"Redistributed Chip Package (RCP) Technology", Freescale Semiconductor, Inc., printed from Internet on Nov. 18, 2006, pp. 1-6.
Keser, Beth, "Birds-of-a-Feather: Redistributed Chip Package (RCP) Broad-Range Applications for an Innovative Package Technology", Freescale Semiconductor, Inc., Jun. 2007, pp. 1-18.
Keser, Beth, "Redistributed Chip Packaging", http://www.semiconductor.net/index.asp?layout=articlePrint&articleID=CA642821, Semiconductor International, Apr. 1, 2007, pp. 1-5.
Kohl et al., "Low Cost Chip Scale Packaging and Interconnect Technology", Proceedings of the Surface Mount International Conference, San Jose, California (Sep. 1997).

* cited by examiner

US 7,868,445 B2

INTEGRATED STRUCTURES AND METHODS OF FABRICATION THEREOF WITH FAN-OUT METALLIZATION ON A CHIPS-FIRST CHIP LAYER

CROSS-REFERENCE TO RELATED APPLICATIONS

This application claims priority from U.S. Provisional patent application Ser. No. 60/945,988, filed Jun. 25, 2007, entitled "Integrated Structures and Fabrication Methods Thereof Implementing a Cell Phone or Other Electronic System", by Eichelberger et al., the entirety of which is hereby incorporated by reference.

TECHNICAL FIELD

This invention relates in general to circuit structures and methods of fabrication thereof, and more particularly, to integrated structures and methods of fabrication thereof implementing a first level metallization directly on a chips-first chip layer.

BACKGROUND OF THE INVENTION

The conventional approach to electronic packaging and interconnect has been to package individual integrated circuit (IC) chips into a single package and to attach these packages to a printed circuit board to provide interconnect between the individual IC chips. In recent years, this approach has met with problems of speed, size and interconnect density due to ever-constant demands for reduced size and increased performance from such integrated circuit packages.

Process speed is conventionally limited by the fact that individual packages have loading capacitance and inductance associated with their relatively long pins and by the large size of conductor runs in the packages relative to the size of the conductors of a bare IC chip. As the speed of computers and other devices continues to increase, the problem of providing electronic packaging and interconnect which provides maximum performance has become a significant challenge. One solution to the problem is the multichip module (MCM). In an MCM, bare (unpackaged) IC chips are interconnected by means of a miniature printed circuit board whose interconnect pitch may match the pitch of the IC chips themselves. There are presently two main classes of MCM. These are the chips-last MCM and the chips-first MCM. In the chips-last MCM, the miniature circuit board is fabricated first and then the bare IC chips are attached and interconnected to the circuit board. The method of interconnect is usually wire-bond or solder bump. In the chips-first MCM, the chips are placed first relative to each other and a miniature circuit board is then built above the chips. The interconnect is formed to the IC chips as an integral part of the processing of the circuit board.

Structures in accordance with the present invention fall into the category of chips-first MCMs. Chips-first MCMs provide one way to minimize size of a multichip module and provide high performance interconnect. Examples of chips-first modules are given in U.S. Pat. Nos. 5,250,843; 5,353,498; and 5,841,193, each of which is hereby incorporated herein by reference in its entirety.

In a chips-first structure, the front surface of the chip layer is conventionally covered by a dielectric layer, which is patterned with via holes exposing contact pads on the upper surfaces of the chips of the chip layer. A metallization is then applied and patterned to make electrical contact to the contact pads and form the interconnect. As a further step, a solder mask may be provided above the dielectric layer with openings to expose the metallization layer, and solder bumps added to provide an electrical interconnect means for connecting the electronic module to, for example, a printed circuit board. In all cases, the dielectric layer is utilized over the chips-first structure, with multiple via openings to the chips' contact pads.

One problem with this approach is that a tight pad pitch can be difficult to connect to when employing a dielectric layer with multiple via openings to interconnect the chips of the chips-first layer. This is because the dielectric layer is relatively thick, and the resolution ability of the dielectric may prevent making the desired via hole pitch. Also, any resist that is used to pattern the metallization layer must also fill the via hole. This increases the effective thickness of the resist, and makes patterning the metal layer more difficult than if the whole assembly was essentially planar.

Another problem with the above-described chips-first interconnect approach is that lithography steps in the process are among the most expensive to perform, and have the greatest impact on process yield. In high volume packaging, fewer lithography steps translates directly into lower cost. In the existing approach, the first interconnect layer is formed by patterning individual via holes in the dielectric layer, and then patterning the metallization. Each of these patterning steps requires at least one lithography step.

SUMMARY OF THE INVENTION

Briefly summarized, this invention comprises, in a first aspect, an electronic module which includes: a chip layer including at least one chip comprising at least one side surface, an upper surface, a lower surface, at least one contact pad at the upper surface, and a pad mask over the upper surface with at least one opening therein exposing the at least one contact pad at the upper surface; a structural material surrounding and physically contacting the at least one side surface of each chip of the at least one chip of the chip layer, the structural material having an upper surface substantially co-planar with or parallel to an upper surface of the at least one chip, and defining at least a portion of a front surface of the chip layer, and a lower surface substantially co-planar with or parallel to a lower surface of the at least one chip and defining at least a portion of a back surface of the chip layer, and wherein the structural material comprises a dielectric material; and a metallization layer disposed over the front surface of the chip layer, the metallization layer residing at least partially on the structural material and at least partially on the pad mask of the at least one chip, and extending over at least one edge of the at least one chip, and wherein the pad mask of the at least one chip of the chip layer and the structural material of the chip layer electrically isolate the metallization layer from the at least one edge of the at least one chip and from one or more electrical structures of the at least one chip.

In another aspect, the invention comprises an electronic module which includes: a chip layer including at least one chip comprising at least one side surface, an upper surface, a lower surface, at least one contact pad at the upper surface, and a pad mask over the upper surface with at least one opening therein exposing the at least one contact pad at the upper surface; a structural material surrounding and physically contacting the at least one side surface of each chip of the at least one chip of the chip layer, the structural material having an upper surface substantially co-planar with or parallel to an upper surface of the at least one chip, and a lower surface substantially co-planar with or parallel to a lower surface of the at least one chip and defining at least a portion of the back surface of the chip layer; an edge protect layer disposed over at least a portion of the structural material, and defining at least a portion of a front surface of the chip layer, wherein the edge protect layer comprises a dielectric material which extends over a portion of the pad mask of the at least one chip at at least one edge thereof, and wherein a majority of the pad mask of the at least one chip of the chip layer is exposed, being uncovered by the edge protect layer; and a metallization layer disposed over the front surface of the chip layer, the metallization layer residing at least partially on the pad mask of the at least one chip, extending over the at least one edge of the at least one chip, and residing at least partially on the edge protect layer, and wherein the edge protect layer, the structural material, and the pad mask electrically isolate the at least one edge of the at least one chip, and one or more electrical structures of the at least one chip, from the metallization layer.

Methods of fabricating the above-summarized electronic modules are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Generally stated, provided herein are numerous enhancements to multichip modules, and in particular, to chips-first multichip modules. Advantageously, described herein are structures and fabrication methods of a chips-first electronic module, wherein a first level metallization is applied directly to the front surface of the chips-first layer, without first applying a dielectric layer over the chips-first layer. Further, provided herein are structures and methods of fabrication which provide a chips-first electronic module with a fan-out metallization, where lithography steps are minimized, and only one lithography step is used for the fan-out metallization. In another aspect, structures and methods of fabricating a multilayer, chips-first electronic module are described below, wherein a first level metallization is applied and patterned before a first level dielectric layer is applied to the chips-first structure. The electronic modules and methods of fabrication described herein provide interconnect to a tight pad pitch, such as associated with today's integrated circuit chips, without the propensity for shorting to adjacent pads. This is accomplished by using the existing pad mask of a bare integrated circuit chip, as well as the surrounding structural material of the chips-first layer, to prevent shorting to adjacent pads, and to isolate other components of the chip as described herein. The electronic modules and methods of fabrication described below are single chip or multichip, chips-first modules.

Reference is now made to the drawings, wherein the same reference numbers used throughout different figures designate the same or similar components.

Figure 1:
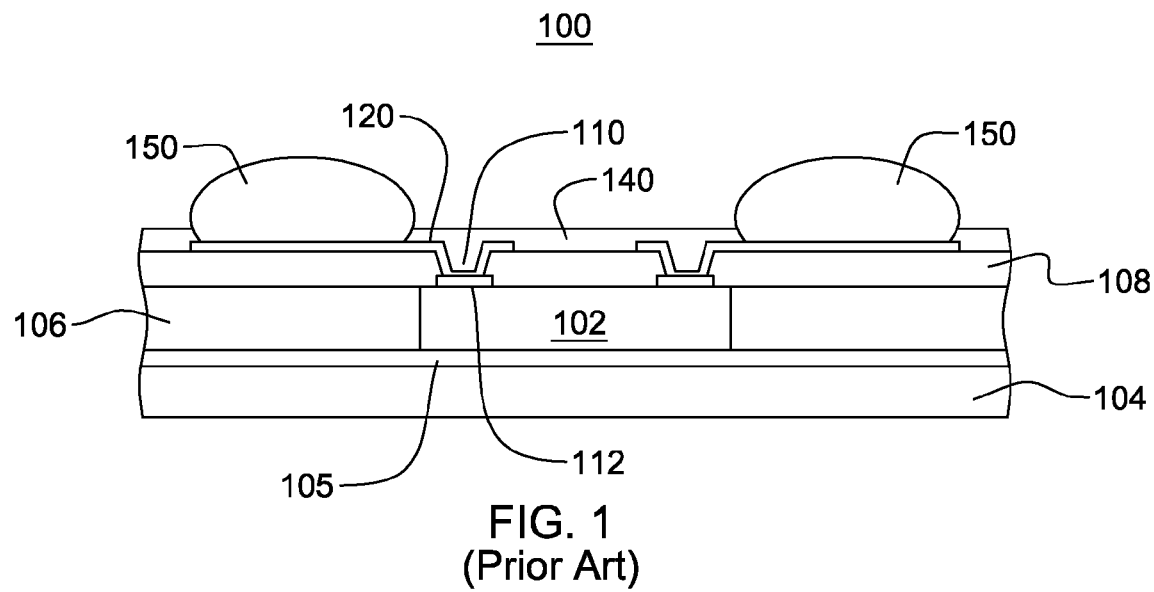
FIG. 1 is a cross-sectional elevational view of one embodiment of a conventional chips-first electronic module.
Figure 2:
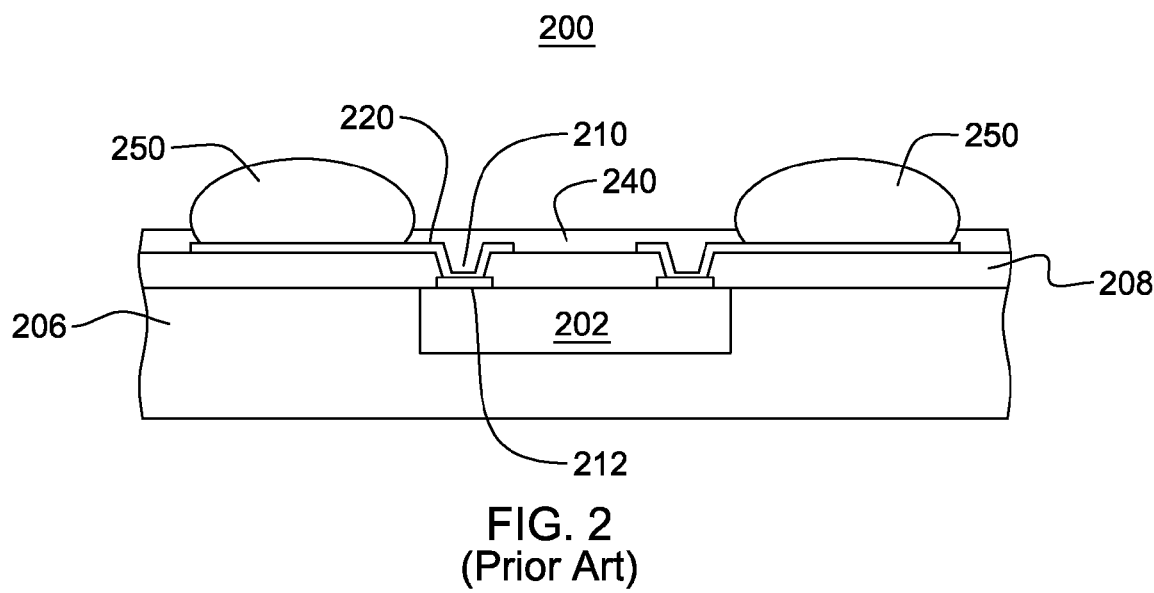
FIG. 2 is a cross-sectional elevational view of an alternate embodiment of a conventional chips-first electronic module.

FIGS. 1 & 2 illustrate generic chips-first modules, incorporating the salient features of the existing art. In FIG. 1, chips-first module 100 is shown, while in FIG. 2, chips-first module 200 is shown. As illustrated, at least one chip 102, 202 is held in alignment in some way, for example, either by attaching chip 102 to a substrate 104 via an adhesive layer 105, or by surrounding chip 202 with a structural material 206 (also referred to herein as a filler/encapsulant). During fabrication, a dielectric layer 108, 208 is then applied over the front surface of the chip layer and vias 110, 210 are formed in the dielectric layer down to chip pads 112, 212 of chips 102, 202. A first level metallization layer 120, 220 is then applied and patterned to make contact to the chip pads and form an interconnect. A solder mask 140, 240 can be provided with openings to expose the metallization layer 120, 220, and solder bumps 150, 250 are then applied to provide an electrical interconnect means for interconnecting the electronic module to, for example, a printed circuit board.

FIGS. 3A-3K illustrate methods for fabricating electronic modules, in accordance with aspects of the present invention.

Figure 3A:
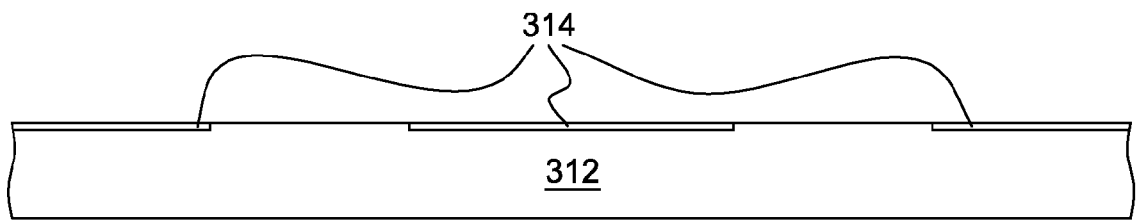
FIG. 3A is a cross-sectional elevational view of a glass alignment plate with a UV-opaque mask pattern employed in fabricating an electronic module, in accordance with an aspect of the present invention.

Referring first to FIG. 3A, in one embodiment of a fabrication approach, an alignment plate 310 is utilized. Details of the use of an alignment plate are provided in U.S. Pat. No. 7,122,467 B2, which is hereby incorporated herein by reference, and in the above-incorporated U.S. Provisional Patent Application Ser. No. 60/945,988, entitled "Integrated Structures and Fabrication Methods Thereof Implementing a Cell Phone or other Electronic System". As illustrated in FIG. 3A, alignment plate 310 includes, in one embodiment, a glass plate 312 and a UV-opaque mask pattern 314 on one side thereof. The glass plate and mask are reusable, with the formation of the UV-opaque mask pattern being well known in the art for making so-called glass masks used in semiconductor and other lithographic processing.

Figure 3B:
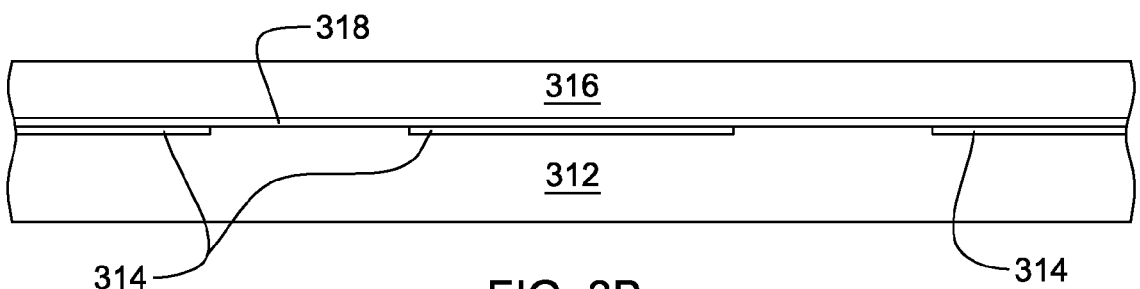
FIG. 3B is a cross-sectional elevational view of the structure of FIG. 3A, after disposition of a UV-release adhesive and a polyester film over the glass plate, in accordance with an aspect of the present invention.
Figure 3C:
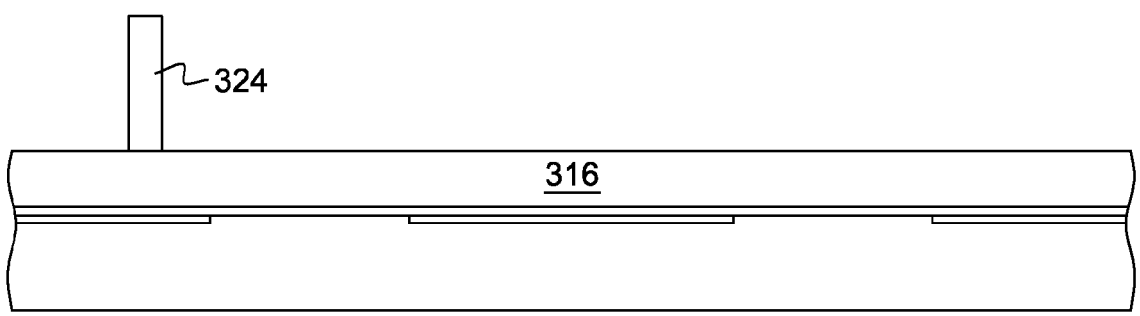
FIG. 3C is a cross-sectional elevational view of the structure of FIG. 3B, after formation of an optional metal structure over the polyester film, in accordance with an aspect of the present invention.

In FIG. 3B, a polyester film 316 coated with a UV-release adhesive 318 has been bonded to the side of glass plate 312 with UV-opaque mask pattern 314. As one example, UV-release film 318 is an Adwill D218 film available from Lintec of Tokyo, Japan. Before continuing, the release film can be exposed to UV light to reduce the adhesion of the film. Although exposure of the tape is normally intended to release the tape, the residual adhesion is not zero and is sufficient for the subsequent processing steps described herein. Further, the cured tape can undergo relatively high temperature processing without the release adhesive bubbling under the polyester film.

In an optional embodiment, a pattern of metallization 324 (FIG. 3C) can be provided on polyester film 316 at this point in the process. The purpose of this metallization is to provide conductive structures 324 in the encapsulant filler material (see FIG. 3F) for establishing, for example, through connects, Faraday shields, thermal conduits and/or low inductance containers for the chips. Details of the application of metal and fabrication of these structures are provided in the above-incorporated U.S. Provisional Patent Application entitled "Integrated Structures and Fabrication Methods Thereof Implementing a Cell Phone or Other Electronic System". The illustrated pattern can be used to form a through connect through the subsequently formed structural material (i.e., encapsulant/filler).

Figure 3D:
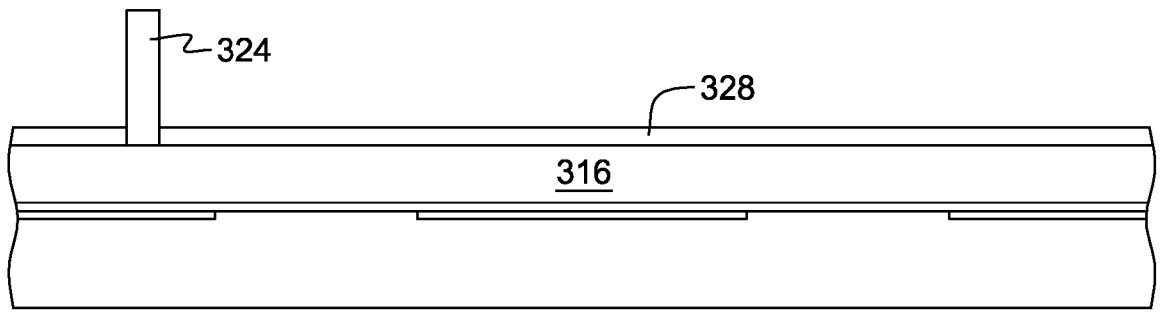
FIG. 3D is a cross-sectional elevational view of the structure of FIG. 3C, after disposition of a UV-curable chip attach adhesive over the polyester film, in accordance with an aspect of the present invention.
Figure 3E:
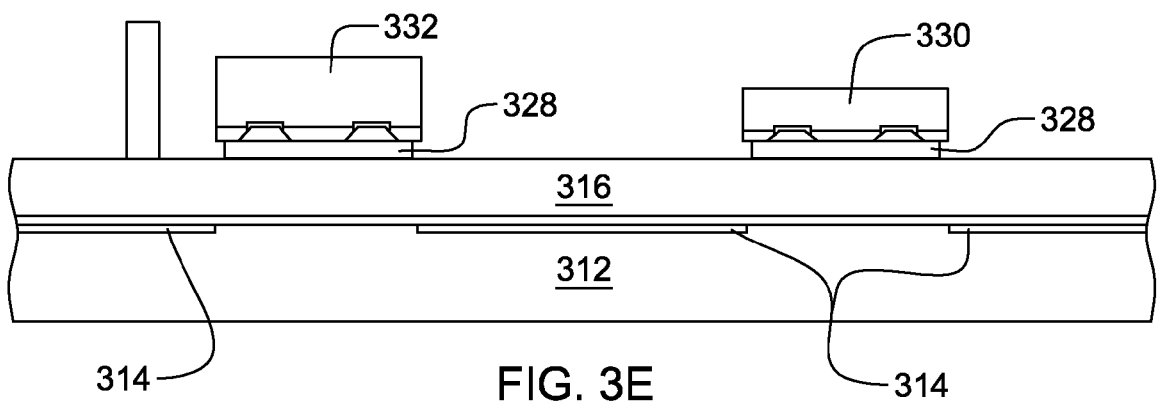
FIG. 3E is a cross-sectional elevational view of the structure of FIG. 3D, after placement of multiple chips onto the UV-curable chip attach adhesive, curing of the adhesive, and plasma etching of the resultant structure to remove uncured chip attach adhesive, in accordance with an aspect of the present invention.

Referring to FIG. 3D, a chip attach adhesive 328 is next applied to the exposed side of the UV-release tape, that is, to the exposed side of polyester film 316. This adhesive is, in one embodiment, an adhesive that can be cured by UV light. Details of using UV-release tape and UV-curable adhesive are provided in U.S. Pat. No. 7,112,467 B2, the entirety of which is hereby incorporated herein by reference. The adhesive can be spray coated onto the UV release film and dried of solvent at 50-75° C. for a period of 30 minutes in a forced hot air oven. By way of specific example, thickness of the UV-curable chip attach adhesive might be 3 to 6 microns. Referring to FIG. 3E, chips 330 and 332 are next placed face down into the UV curable adhesive 328 on polyester film 316. Note that the masking pattern 314 openings align with the placement of the chips.

Figure 3F:
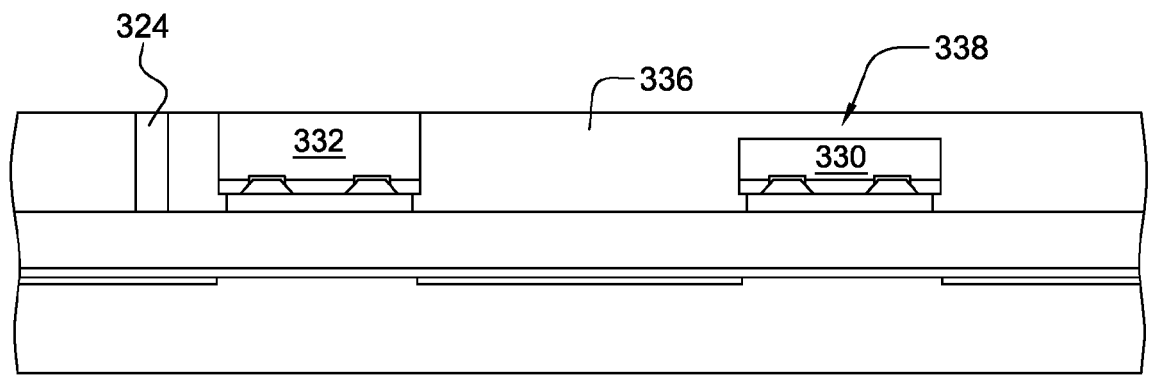
FIG. 3F is a cross-sectional elevational view of the structure of FIG. 3E, after disposition of a structural material over the polyester film and surrounding the chips, in accordance with an aspect of the present invention.

Additionally, the masking pattern can have features, not shown, that aid pick and place equipment in accurately placing the chips. The UV-curable chip attach adhesive 328 is irradiated from the glass 312 side using a collimated UV source (not shown). The area under the chips is exposed while the area away from the chips remains unexposed. The adhesive is then developed in a spray developer using propanol as the developer. This removes the adhesive everywhere except under the chips 330, 332. The positioning and size of the mask openings are such that a small area around the edge of each chip is also removed by the developer. It can be seen that each chip is now face down on a small pedestal formed by the exposed chip attach adhesive 328. It is desirable to clean and prime the chip before applying the structural material (i.e., the filler/encapsulant) so that the adhesion of the filler/encapsulant to the chips is enhanced. A suitable plasma etch condition is 6 minutes at 400 W in a barrel etcher using 30% $CF_4/O_2$ gas. This cleans all exposed surfaces of the chips including the area around the edges of the chips. It also removes a small amount of the polyester film 316, increasing the height of the resultant pedestal. As shown in FIG. 3F, a dielectric filler/encapsulant 336, such as a liquid epoxy resin, is added to the assembly to cover all exposed surfaces on the back. To increase strength and improve the expansion match of the filler/encapsulant to that of the silicon chips, the filler/encapsulant can be loaded with an inert powder such as alumina or glass particles. The filler/encapsulant can be poured or dispensed onto the alignment carrier, or the alignment carrier may be covered at its outer edges or other locations on the carrier with a mold form and injection molded, or covered with a frame and frame molded.

In one embodiment, the filler/encapsulant is dispensed by a liquid dispensing machine such as a Cam-A-Lot Dispensing Machine available from Cam-A-Lot Division of Cookson Electronic Equipment located in Franklin, Mass. The dispensing machine accurately dispenses the relatively high viscosity loaded epoxy to the edge of the alignment carrier. The viscosity keeps the filler/encapsulant from flowing off the carrier. This eliminates the need for molds or frames in the fabrication process. Alternatively, a mold may be used if it is required to contain the filler/encapsulant in cases where viscosity is low or where injection molding is used. Epoxy Molding Compound or Underfill Material suitable for this application is also available from Cookson Electronics-Semiconductor Products of Suwanee, Ga.

In one embodiment, a two-part epoxy system is used, which can be cured at or near room temperature. The epoxy is filled, in one embodiment, with approximately 80 weight percent of alumina powder.

The epoxy is allowed to cure at low temperature so that no expansion effects impact stress and initial alignment of the chips. The cured filler/encapsulant is then lapped or ground to the appropriate thickness. The filler/encapsulant and chips are thinned to a minimum thickness. This thickness is currently in the range of 50 to 100 microns. It is possible to go thinner than that thickness, but there is a tradeoff between lapping/grinding speed and final chip thickness. It is well known that there is typically damage beneath the exposed surface layer that is proportional to the lapping or grinding grit size. However, a finer grit would result in a longer lapping/grinding time. Noting that the chips are rigidly held by the alignment carrier, there is little penalty in going very thin except the economy of lapping/grinding more slowly or using multiple grit sizes. There are presently automated grinders available that have a fine and coarse grinding wheel in the same system. Such a system is the Disco DFM2700 and the Disco DFG8560 available from DISCO Corporation of Tokyo, Japan. Tapes for the process are available from Lintec Corporation of Tokyo, Japan or Mitsui ICROS of Tokyo, Japan. Lapping/grinding exposes the conductive through structures 324 for further processing. Alternatively, if the chips are adequately thinned before application of the filler/encapsulant, then the filler/encapsulant can be lapped/ground to a thickness that is greater than the chips, but still exposes the through connects and other conductive through features. Practical molding techniques could also achieve this without a lapping/grinding step to thin the filler/encapsulant.

FIG. 3F shows both of these cases in cross section in the same multichip layer. Note that chip 1 330 is thinner than the final thickness of the filler/encapsulant 336. The filler/encapsulant covers the back of this chip as well as the sides. The area of encapsulant that is thicker than chip 1 is denoted 338. Chip 2 332 is thinned during lapping of filler/encapsulant 336, and thereby is the same thickness as the filler/encapsulant, so that filler/encapsulant only contacts the sides of this chip. Note also that through connect 324 is uncovered by the lap/grind operation so that electrical or thermal connection may be made to this type of conductive through structure. While the example embodiment illustrates only two chips, it will be appreciated by those skilled in the art that generally an entire panel of chips may be processed at a time to take advantage economy of scale. Also, note that the term "chip" is meant to encompass all manner of semiconductor, resistor, capacitor, inductor, conductive slug, electronic or optoelectronic device that may be accommodated by the processing described herein. It is also understood that both single and multiple chip modules are included in the scope of the present invention as defined by the appended claims.

Attaching Process Carrier and Initiating Processing on Upper Surface:

It should be noted that additional processing on the back surface of the module can be accomplished as disclosed in the above-incorporated U.S. Provisional Patent Application Ser. No. 60/945,988, entitled "Integrated Structures and Fabrication Methods Thereof Implementing a Cell Phone or Other Electronic System". Any of the structures fabricated on the back surface of the modules disclosed therein could also be accomplished in combination with the electronic module structures described herein. In the interest of brevity, this disclosure focuses on the process steps employed to achieve a first level patterned metallization interconnect directly above the chips without the requirement, as taught in the prior art, of first applying a first level dielectric layer and forming individual via holes therein.

Figure 3G:
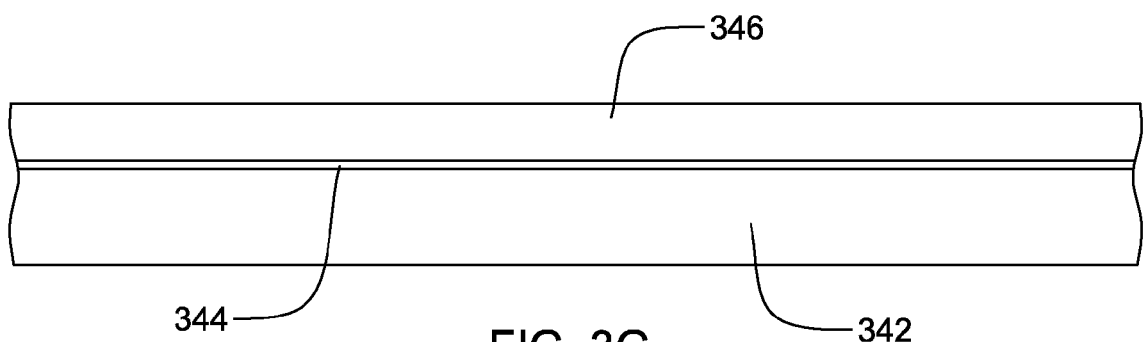
FIG. 3G is a cross-sectional elevational view of a structure comprising a permanent process carrier, bonding adhesive and a temporary process carrier, employed in fabricating an electronic module, in accordance with an aspect of the present invention.
Figure 3H:
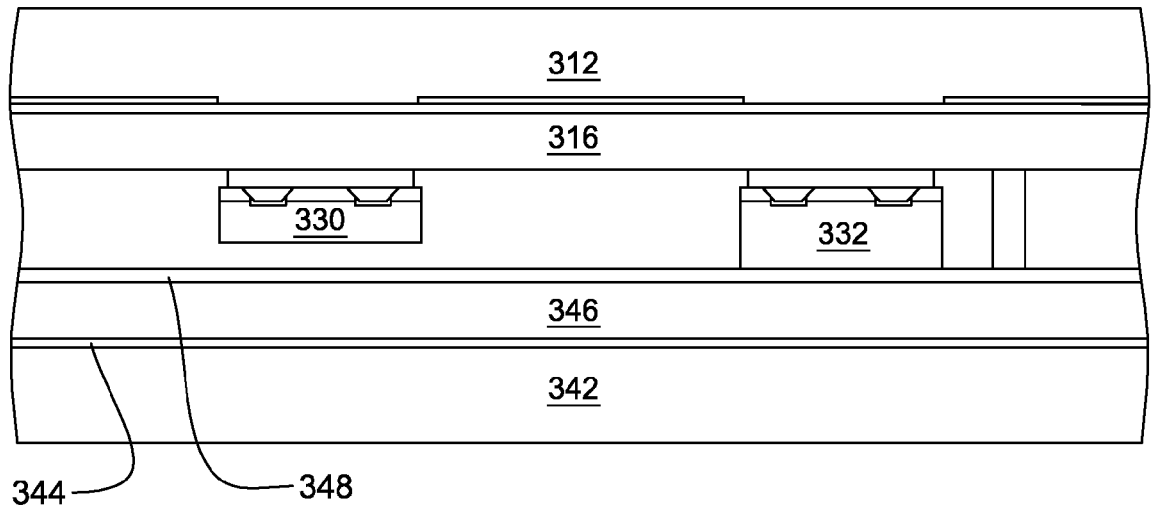
FIG. 3H is a cross-sectional elevational view of the structures of FIGS. 3F & 3G, after inverting the structures and bonding the permanent process carrier to the back surface of the chip layer, in accordance with an aspect of the present invention.

Continuing with the figures, and as illustrated in FIGS. 3G & 3H, a process carrier (if desired) can next be attached to the back of the module. This process carrier, which gives stiffness to the assembly when the chips and filler are very thin, may be a permanent stiffener that is left in place after processing is complete (e.g., to give stiffness to the module) or it may be removed at the end of processing. In either case, the process carrier also serves another useful function. Before the process carrier is attached to the back of the assembly the chips are held in exact alignment by the alignment carrier. If the process carrier is attached before the assembly is removed from the alignment carrier, then the process carrier will continue to hold the chips in alignment. If the assembly is removed before the process carrier is attached, then shrinkage of the encapsulant/filler will tend to move the chips relative to one another and impact the exact alignment. The greatest impact is in the area of lithography where alignment would otherwise be affected to the extent that large panels could not be accurately aligned and exposed using a single alignment for the entire panel. This could significantly effect the throughput economics of the lithography steps of the process. As an alternative embodiment, if the filler/encapsulant is strong enough to stand on its own through out the processing, then no process carrier is attached to the back of the assembly. This has the advantage that no process carrier is required and the cost of the process carrier and its attachment are eliminated, although the precision alignment might be effected. Steppers are now available that may be used to perform multiple alignments and exposures over the panel to partially compensate for the shrinkage caused misalignment.

FIG. 3G shows one embodiment of a process carrier that includes two parts: a temporary process carrier 342, to hold the assembly rigidly during processing, and a thin permanent process carrier or substrate 346, which is configured and sized to give a sufficient rigidity to the individual resultant modules. Temporary process carrier 342 is adhesively bonded with an adhesive 344 to thin permanent process carrier 346. As explained below, at the end of processing, the temporary carrier is separated from the permanent process carrier leaving the permanent carrier as a thin substrate for the individual modules. It should be understood that if the entire process carrier is to be removed, then the two part process carrier would not be necessary and the process carrier might include the temporary process carrier only.

Details on attaching a process carrier may be found in the above-incorporated U.S. Provisional Patent Application Ser. No. 60/945,988, entitled "Integrated Structures and Fabrication Methods Thereof Implementing a Cell Phone or Other Electronic System". In this provisional application, the process carrier and alignment assembly are taped into frames. These pieces are then placed in a laminating fixture such that excess adhesive is contained by the tape, and the alignment carrier assembly and process carrier are held in alignment during the attachment process. FIG. 3H shows the resultant structure with the process carrier 346, 344, 342 attached to the alignment carrier 312, 316 (holding the integrated structures 330, 332) via adhesive 348.

Figure 3I:
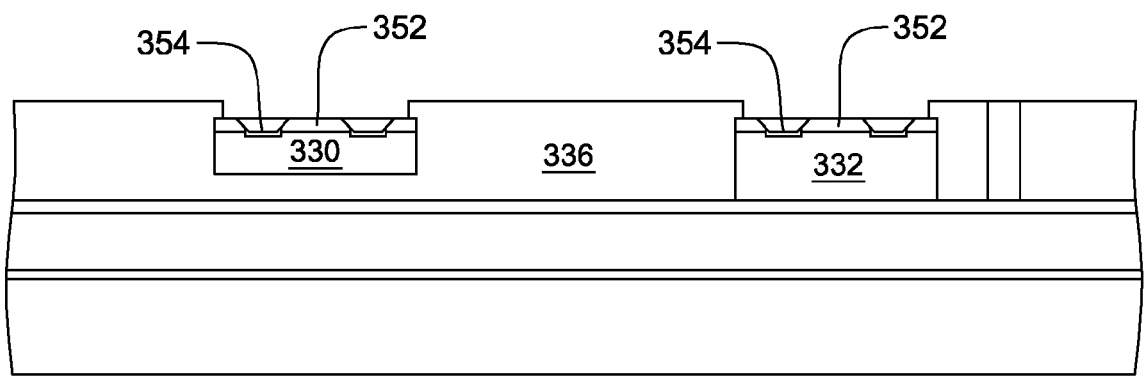
FIG. 3I is a cross-sectional elevational view of the structure of FIG. 3H, after removal of the glass alignment plate, polyester film and cured chip attach adhesive over the pad masks of the chips, in accordance with an aspect of the present invention.

The alignment carrier is next separated from the partially processed chips-first base, as illustrated in FIG. 3I. Note that the UV-release tape has already been exposed to UV energy and therefore has minimal adhesion to the glass plate with the UV-opaque mask pattern on one side. The alignment carrier can be easily removed by prying from a corner. Moderate heating of the assembly at this point aides the removal process as it slightly softens the adhesive and makes separation easier. Additionally, the removal process is aided by making the process carrier slightly smaller than the alignment carrier. This prevents any adhesive squeezed out during the lamination operation from adhering to the alignment carrier edges. If the adhesive does contact the edge of the alignment carrier it bonds the two carriers at the edges and hampers separation. The separation occurs at the UV-release adhesive to alignment carrier glass interface and therefore leaves the UV-release film attached to the top of the partially processed chips-first module. At this point, a corner of the film is engaged and peeled in a 90 degree peel. This process works because of the difference between the adhesion of the film over an area and the adhesion of the film when peeled. It should be noted that the adhesion is quite sufficient to hold the chips in accurate position due to high shear capability of a thin glue line over the area of the chips. When a 90 degree peel is initiated, the adhesive gives up readily as the adhesive force of the very thin adhesive is spread over a concentrated area of the bend point of the peel.

Any residual adhesive left on the chips is now cleaned off. The first step in this process is to soak the structure in acetone, which lifts the cured adhesive film from the tops of the chips. The second step is a light plasma etch, with either $O_2$ or $O_2/CF_4$ (30/70) to remove any residual adhesive that was not removed by the acetone soak. A final step is cleaning by wet processing (heated surfactant and DI water) which removes any residual ions such as sodium and chloride from the surface of the chips. FIG. 3I shows a cross-sectional view of the chips-first base ready for application of the interconnect layer(s). Note that the entire edge of each chip 330, 332 is covered by the filler/encapsulant 336, and only a small portion of the upper surfaces of the chips (around the edges thereof) is covered by the filler/encapsulant 336. Note further that the chips' pad masks 352 provide an insulating layer above the chips and provides access to the individual pads 354 of the chips. When IC chips are fabricated, they are provided with a passivation layer on the top surface of the chip that mechanically and electrically protects the chips. This passivation layer is provided with openings to the contact pads of the chips, and this passivation layer with openings is referred to in this description as a pad mask. For the purpose of this disclosure, a pad mask is any layer that is applied to the surface of the chips before they are placed into a chips-first module, and which provides dielectric insulation of the chips and allows access to the contact pads of the chips. This layer is typically applied by the chip manufacturer before the wafer is diced into individual chips, but for this discussion, may alternatively be applied after dicing, thereby potentially coating both the top surface and a portion of the edges/sides of the chip.

At this point (in prior art structures not employing a filler/encasulant configured as described above), a first level dielectric would be applied and via holes patterned above individual chip pads. The first level dielectric layer conventionally serves to prevent shorting of subsequent metallization at the edges of the chips. After application of the dielectric layer, metallization would be applied and patterned to form the first level interconnect layer. In accordance with an aspect of the present invention, however, the complete coverage of the chip edge by the filler/encapsulant 336 prevents shorting of a subsequently applied first level metallization at the edges of the chips, and the pad masks 352 already on the chips 330, 332 prevent shorting of the metallization to electrical structures of the chips.

In one embodiment, first level metallization is sputtered onto the chips 330, 332 and the encapsulant/filler 336. Sputtering is well known in the art and includes the steps of back-sputtering in order to clean the surface, remove insulating oxide on the chip pads, and improve adhesion of the metal layers. This is followed, in one embodiment (and without breaking vacuum), by sputtering a thin layer of titanium for adhesion, followed by a seed layer of copper. The titanium thickness may be 200 angstroms and the copper thickness 4000 angstroms. A resist layer is then coated over the sputtered copper, and the resist is exposed and developed. Resist materials with excellent aspect ratio are well known in the art, and include, for example, AZP 4620 (a positive resist available from AZ Electronic Materials of Somerville, N.J.) and BPR 100 (a negative resist available from Shipley of Marlborough, Mass., now part of Rohm and Haas, of Philadelphia, Pa.). The resist is patterned with openings where the copper interconnect runs are desired. The copper is then electroplated to a thickness required by subsequent processing steps. A thickness of 6 to 12 microns may be used. The resist is removed by methods well know in the art, and depending on whether a positive or negative resist is used. The sputtered copper and titanium is removed by etching the copper in ammonium persulfate and etching the titanium in a $CF_4/O_2$ (95/5) Reactive Ion Etch Plasma.

Alternatively, an argon ion plasma may be used. The plasma is preferred to wet chemical etching of the titanium since it is very accurately controlled and will do minimal damage to the aluminum pads and pad masks of the chips. This is especially true if the metalization pattern is made smaller than the opening of the pad masks. The making of the metalization pattern smaller than the pad mask's openings allows improved resolution and less sensitivity to slight misalignment of the chips. It should be noted that the pad mask on small pad pitch chips involves relatively large openings for probing and wirebonding with minimal space between adjacent pad openings. Copper metalization is now common in high performance chips.

Frequently, the pads of the chips include copper with a layer of aluminum to allow for improved wirebonding. This is not required in the structures described herein, and bare copper pads may be used. In the case of bare copper pads, if the seed copper etch step damages the pads, the thickness of the titanium layer may be increased (for example) to 1000 angstroms to protect the copper pads on the chip. It should also be noted that no damage to the pads will occur if the pad mask is framed by the metallization pad, but this may significantly increase sensitivity to misalignment. This discussion is intended to identify some of the options and advantages that are afforded by structures fabricated in accordance with aspects of the present invention. The ability to pattern the first interconnect layer without deep vias through a dielectric allows for finer resolution, which is important in making interconnection to fine pitch chips.

Figure 3J:
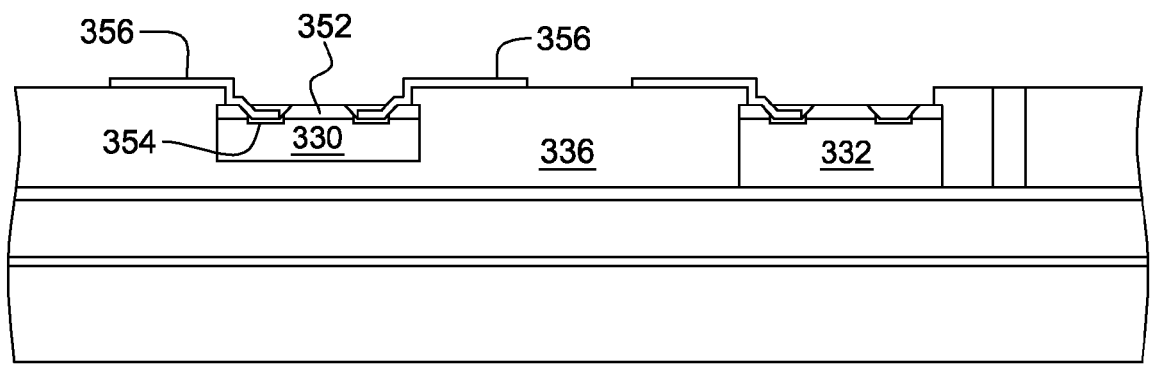
FIG. 3J is a cross-sectional elevational view of the structure of FIG. 3I, after disposition of a patterned metallization layer over the front surface of the chip layer, producing one embodiment of an electronic module, in accordance with an aspect of the present invention.

FIG. 3J illustrates a cross-sectional view of an electronic module, in accordance with an aspect of the present invention. As shown, the module includes a first level patterned (e.g., copper) interconnect layer 356 disposed on filler/encapsulant 336 and pad mask 352, and making connection to the contact pads 354 of the chips 330, 332.

In an alternative embodiment for achieving a patterned first level metallization, the metal layer may be sputtered as described above, but this time the copper is sputtered to a thicker layer, for example, in the range of 1 to 3 microns. Resist is applied and patterned to leave resist in the area where the metallization pattern is desired. The copper is then etched away using the resist as an etch mask. The etching of copper to form patterns is well known in the art. The resist is stripped as described above and the titanium is etched as well, as described above. This process results in thinner copper than the plating approach, and utilizes slightly fewer steps. As described above, the titanium protects chip circuitry that is sensitive to copper etchant. The titanium is etched by well controlled processes that present little attack to the bond pads and pad mask. Once again, the end result is a patterned interconnect 356 covering the filler/encapsulant 336 and pad mask 352 on the chips and making connection to the contact pads 354 of the chips 330, 332, as illustrated in FIG. 3J.

Multiple Metal Layer Structures:

In addition to single metal layer structures, the concepts disclosed herein may be used as the base for a multiple metal layer structure. In the exemplary embodiment of FIG. 3K, a first level dielectric layer 358 is coated over the first level metal layer 356. This dielectric layer is applied as a liquid, dried and hardened in all areas except via openings 360 by exposing the dielectric through a mask with collimated UV light. In one embodiment, dielectric layer 358 is a low modulus, high elongation dielectric material. Details of processing and formulations of low modulus high elongation dielectrics are provided in U.S. Pat. No. 6,426,545 B1, which is hereby incorporated herein in its entirety. A commercially available low modulus high elongation photo-patternable dielectric is SINR 3170 available from Shin-Etsu MicroSi of Phoenix, Ariz. Alternatively, other photo-patternable and non photo-patternable in situ formed dielectrics such as epoxy or BCB may be used. In addition, a fully cured material such as kapton polyimide may be adhesively bonded in place to form the dielectric layer. In cases where the material is not photo-patternable, the openings can be formed by laser ablation or by reactive ion etching. Both techniques are well known and suitable parameters for the polymer dielectrics described above are discussed in U.S. Pat. No. 5,250,843, which is hereby incorporated herein by reference in its entirety.

Next a seed layer of copper is sputtered over the dielectric and into the openings to make connection to the metal layer below and other conductive structures below (such as the exemplary through conductor, Faraday shields, thermal slugs, etc.), as well as to chip pads that were not connected to when the first layer of metal was applied. In one embodiment, the actual sputtering operation includes providing a very thin adhesion layer of titanium. Sputtering is well known in the art. The thickness of titanium may be 200 angstroms, followed by 4000 angstroms of copper. A resist layer is coated over the sputtered copper. The resist is then exposed and developed. Resist materials with excellent aspect ratio are well known in the art. The resist is patterned with openings where the copper interconnect runs are desired. The copper is then electroplated to a thickness required by subsequent processing steps. A thickness of 6 to 12 microns may be used. The resist is removed by methods well known in the art, dependent on whether a positive or negative resist is used. The sputtered copper and titanium is removed by etching the copper in ammonium persulfate and etching the titanium in 5% TFT etchant in DI water. TFT Etchant is available from Transene Co. of Danvers, Mass. Additional interconnect layers can be patterned by repeating the steps of applying dielectric, patterning openings in the dielectric, sputtering copper, applying photo resist, patterning the resist, electroplating the copper and stripping the resist and etching the sputtered seed layer.

Figure 3K:
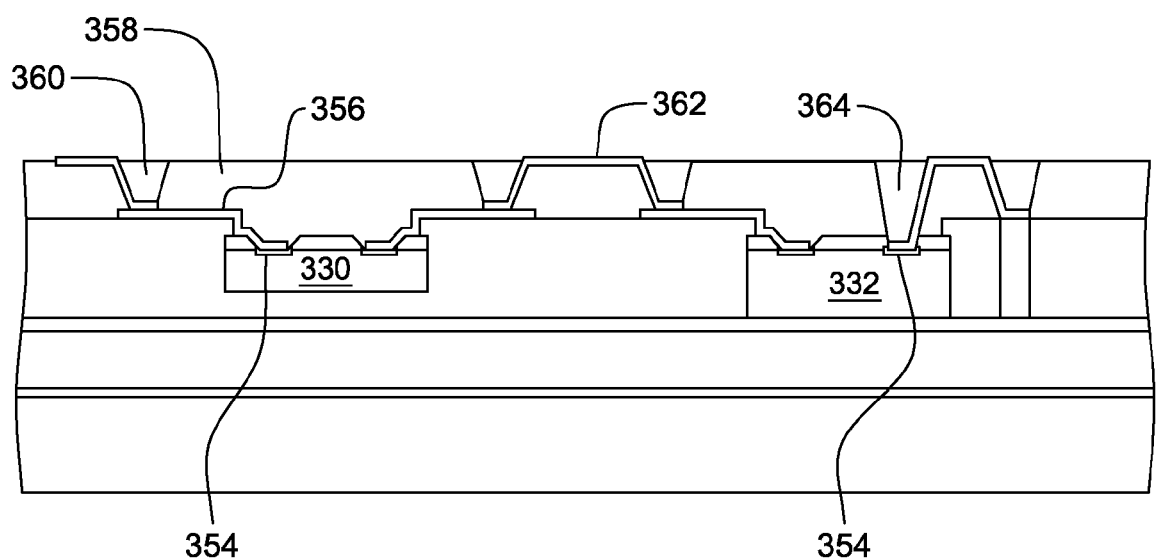
FIG. 3K is a cross-sectional elevational view of the structure of FIG. 3J, subsequent to disposition of an optional first level dielectric layer over the front surface of the chip layer, including over the patterned metallization layer thereon, and providing a second level metallization layer extending at least partially within patterned vias in the first level dielectric layer, in accordance with an aspect of the present invention.

FIG. 3K shows a cross-section view of one embodiment of a resultant structure, with a first level dielectric layer 358 and a second level metal layer 362 having been added. Note that connection can be made from second level metal layer 362 to both the first level metallization 356 and also to one or more pads 354 of the chip. In cases where it is desired, a via hole 364 in the first level dielectric layer 358 may be positioned over an individual chip pad 354 of a chip 332, and interconnect made from the second metal layer 362 directly to the pad of the chip though the via. This is essentially as done in prior art structures and gives the option of directly contacting chip pads from two levels of metallization. Such a structure for example would aid in crossover in complex layouts.

Figure 4A:
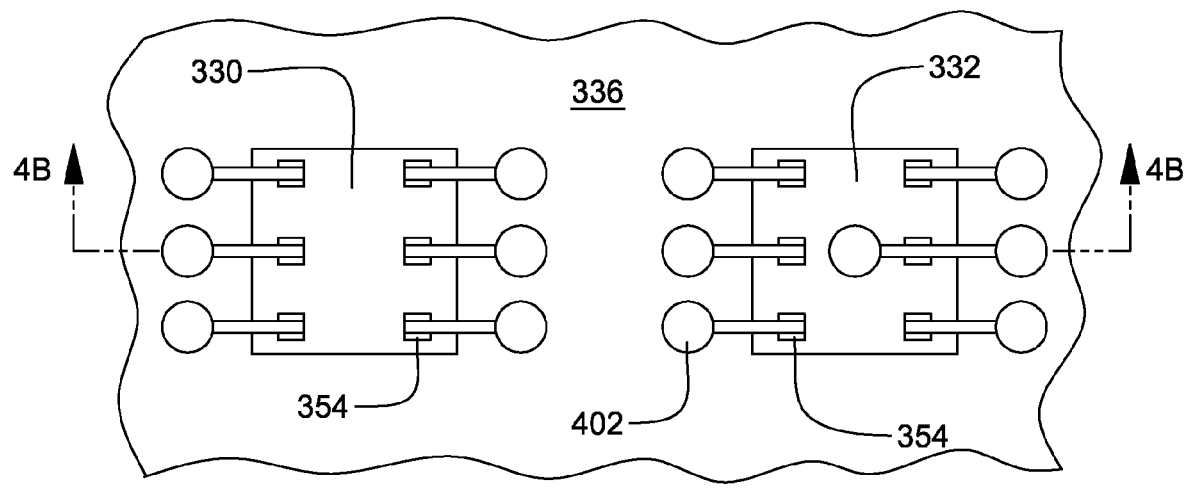
FIG. 4A is a top plan view of one embodiment of a first level fan-out metallization configuration achievable with the electronic module of FIG. 3J, in accordance with an aspect of the present invention.
Figure 4B:
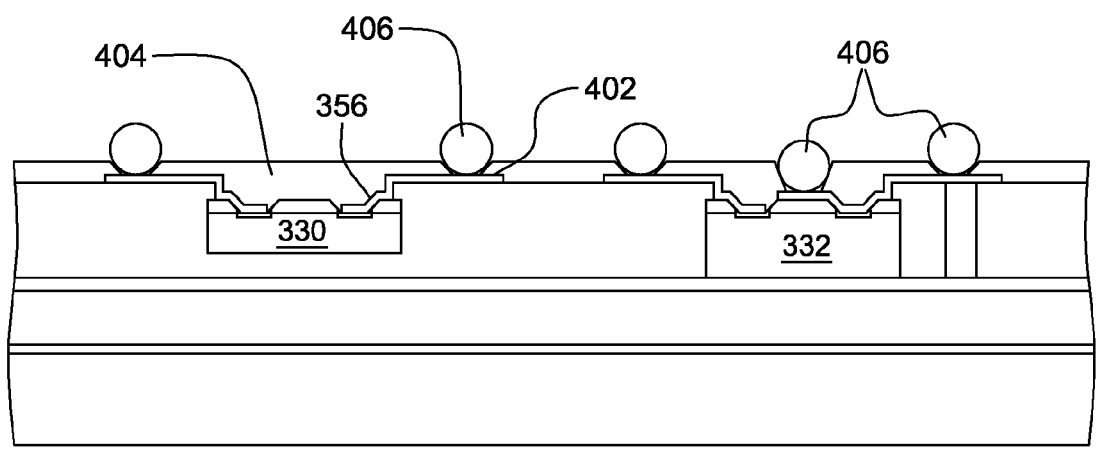
FIG. 4B is a cross-sectional elevational view of the structure of FIG. 4A, taken along line 4B-4B, and illustrating provision of a solder mask over the structure of FIG. 3J, and provision of input/output solder bumps within patterned openings in the solder mask, in accordance with an aspect of the present invention.

Single Layer Fan-Out Structures:

One especially significant case is in the area of chip fan-out where only a single metallization layer is required. Fan-out refers to the process where interconnection from chip pads leads to I/O connections, some of which are outside the perimeter of the chip. For a single metal layer, fan-out pattern metallization makes connection to the chip pads on one end and forms conductors for solder bumps on the other end. FIGS. 4A-4B illustrate several steps in fabricating a single layer fan-out structure, in accordance with an aspect of the present invention. FIG. 4A is a top plan view showing a single level metallization pattern connecting chip (330, 332) pads 354 to input/output pads 402 disposed over structural material 336. After metallization is applied and patterned as described above, a solder mask 404 can be applied and patterned to provide openings where the solder bumps are to be formed. Solder bumps 406 are then formed (for example) by applying solder paste and reflowing the paste in a solder reflow oven. Application of solder paste and reflow are well known in the art for fabrication of solder bumps on wafer level packaging and chip scale packages. FIG. 4B illustrates an electronic module with a single layer of metal 356, a solder mask 404 and bumps 406. Note that no dielectric layer application or patterning step was required in the process, eliminating the cost and yield loss of those processing steps. This compares favorably to a prior art single metal layer module, such as shown in FIG. 1 or 2, wherein a first dielectric with vias to individual chip pads lies between the metallization and the chip.

Figure 5A:
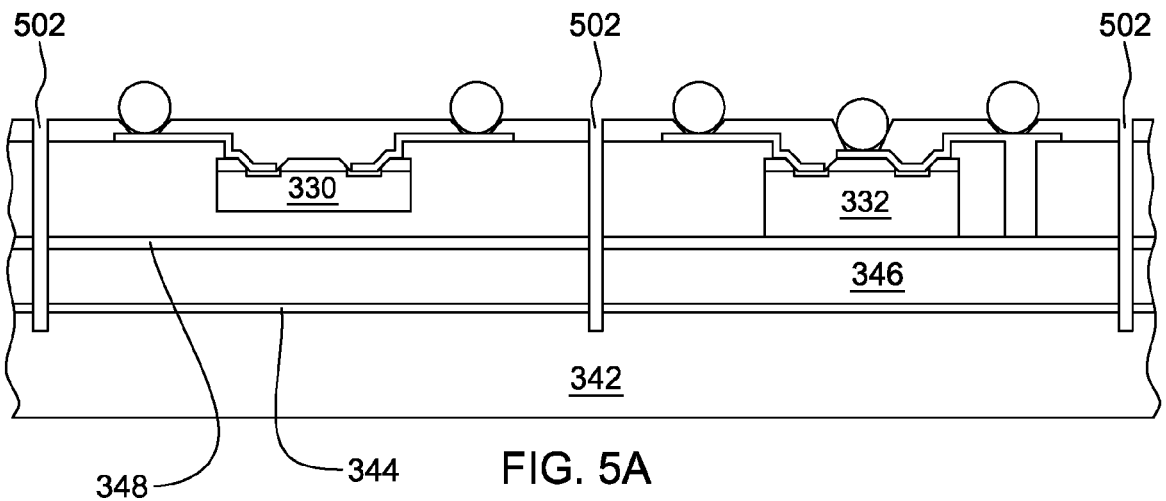
FIG. 5A is a cross-sectional elevational view of the structure of FIG. 4B, after partially cutting through the structure during processing to produce single-chip electronic modules, in accordance with an aspect of the present invention.
Figures 5B, 5C:
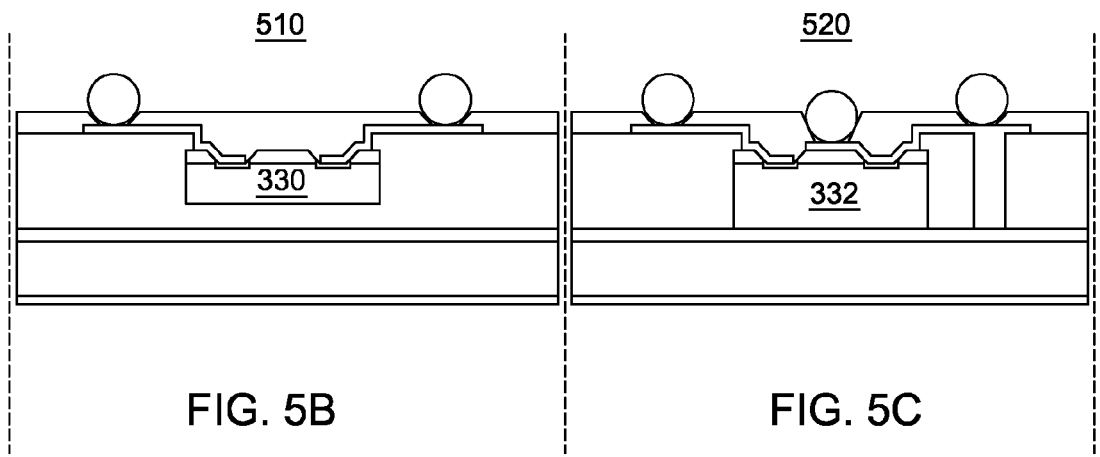
FIGS. 5B & 5C illustrate the structure of FIG. 5A after removal of the temporary process carrier, with FIG. 5B illustrating one embodiment of a chips-first electronic module containing a single chip, and FIG. 5C illustrating another embodiment of a chips-first electronic module containing a single chip, in accordance with an aspect of the present invention.

Singulation of Panel:

Although shown as only two chips, the concepts disclosed herein can be employed to advantageously fabricate a panel including a large number of chips so that economy of scale may be achieved. Processing may be completed by singulation of the panel of modules into individual modules. If a temporary process carrier is used, then the individual modules may be singulated by dicing part way into the process carrier from the module side of the assembly and then removing the process carrier leaving the singulated modules, as illustrated in FIGS. 5A-5C. Fully automated equipment typically used for singulating wafers may be used to accomplish this operation. This process is known as Dice Before Grind (DBG).

Figure 6A:
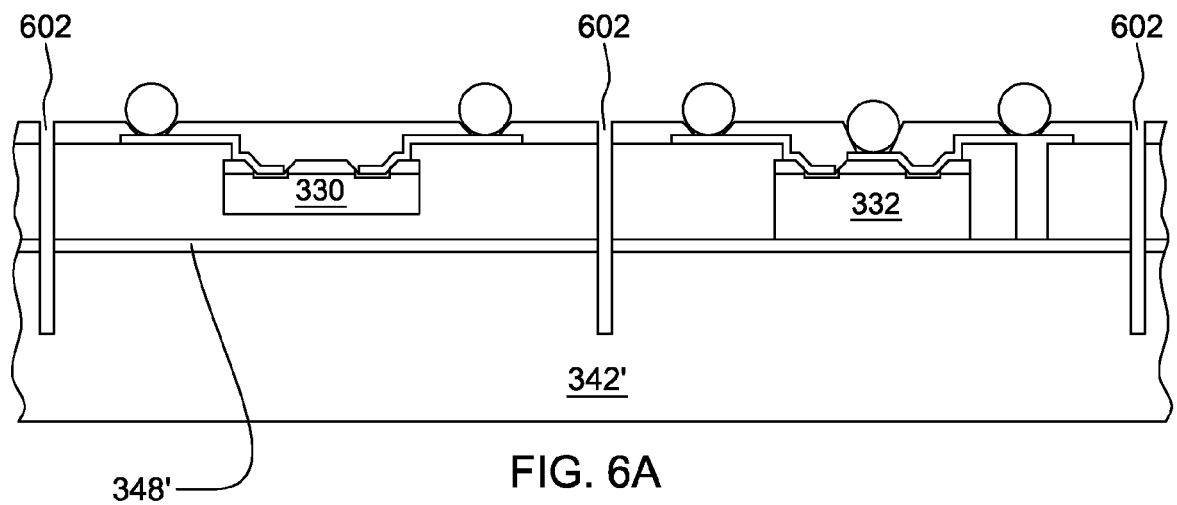
FIG. 6A is a cross-sectional elevational view of an alternate embodiment of the structure of FIG. 4B, after partially cutting through the structure during processing to produce single-chip electronic modules (wherein the structural material is sufficiently thick to omit the permanent process carrier employed in the embodiment of FIGS. 5A-5C), in accordance with an aspect of the present invention.
Figures 6B, 6C:
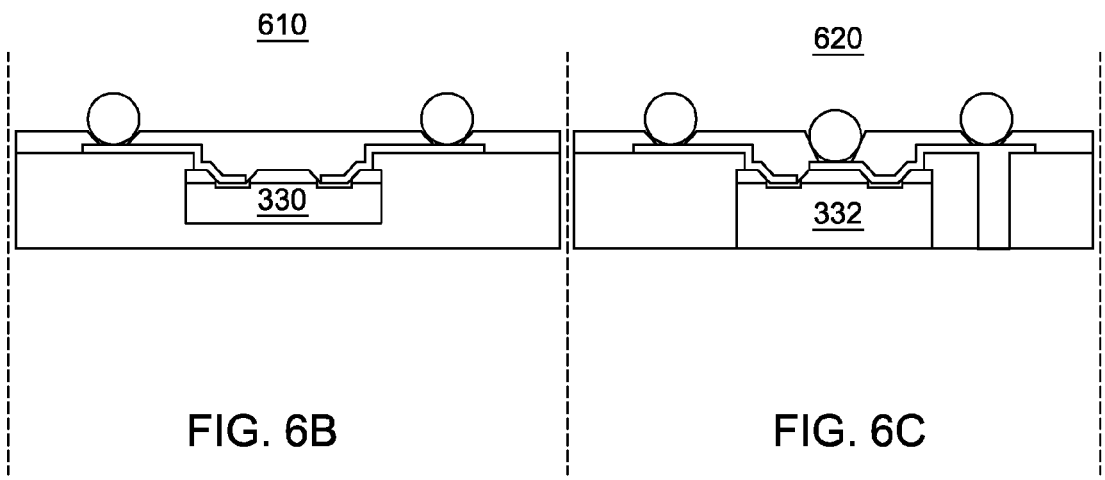
FIGS. 6B & 6C illustrate the structure of FIG. 6A after removal of the temporary process carrier, with FIG. 6B illustrating one embodiment of a chips-first electronic module containing a single chip, and FIG. 6C illustrating another embodiment of a chips-first electronic module containing a single chip, in accordance with an aspect of the present invention.

Two process flows are shown in FIGS. 5A-5C & FIGS. 6A-6C. FIGS. 5A-5C illustrate the process flow for singulation of chips 330, 332 if the process carrier includes both a temporary process carrier 342 and a permanent carrier 346. FIGS. 6A-6C illustrate the process flow if the process carrier is a temporary process carrier 342' only. First a diamond saw or laser cuts partway into the panel deep enough to cut into the process carrier 346, 342 (or 342') or at least the process carrier adhesive 348, 344 (or 348'). This is shown in FIGS. 5A & 6A. The partially cut panel is attached at its upper surface to soft protective tape (not shown), where the soft tape accommodates the thickness of the I/O bumps on the module. Next, the process carrier is ground until the proper thickness is achieved. In the case where a permanent process carrier/substrate has been bonded to the temporary process carrier, the grinding stops after the temporary process carrier has been removed, or until the permanent process carrier has reached the desired thickness. This is shown in FIGS. 5B and 5C, wherein separate electronic modules 510, 520 are produced. In the case where this filler is thicker than the chips, the grinding stops when the filler/encapsulant has been reached or when the desired thickness of the module has been achieved. This is shown by the electronic module 610 illustrated in FIG. 6B. Finally grinding may proceed until the backs of the chips are reached in which case the backs of the chips as well as any through connects will be exposed, as shown by electronic module 620 in FIG. 6C. This option is of benefit in stacked systems where minimum thickness is desirable. In each case, the next step is to laminate a tape to the back of the modules and then peel away the protective tape (not shown). At this point, the individual singulated modules may be picked and placed by conventional pick and place equipment intended to pick Wafer Level CSP modules. Disco of Tokyo, Japan and others sell complete turnkey systems for the DBG process including dicing, protective taping, grinding, back side taping and removal of the protective tape.

It should be noted that the novel structure of a chips-first module fabricated on a process carrier affords a unique approach to singulation of modules from a panel. As mentioned above the process carrier maintains precision alignment of chips in the face of shrinkage and warping of the filler/encapsulant. In addition, a unique singulation technique is enabled. The steps for this process may be understood by again referring to FIGS. 5A-5C and FIGS. 6A-6C. First the panel is partially cut as is shown in FIGS. 5A and 6A. Next a laser is focused through the glass process carrier onto the adhesive that attaches either the process carrier to one of the permanent process carrier (substrate), the filler/encapsulant or the exposed surface of the chips and through connects. The laser energy vaporizes a small portion of the adhesive and this separates the individual modules from the temporary glass process carrier. In one embodiment, the individual parts may be dropped directly into waffle packs and be ready for pick and place or other assembly operations such as test or burn-in. If quartz glass is used as the temporary process carrier, then a UV laser may be used since the quartz is not absorbing at UV wavelengths. If ordinary glass is used, visible or IR light is most advantageously used. In each case, the adhesive should be absorbing at the laser wavelength so that it is readily vaporized by the processing. The residual adhesive may be left on the module or removed by laser ablation or plasma etching.

Variations on Process:

If the filler/encapsulant used has a low modulus high elongation characteristic, then the bumps in the fan-out structure that are not directly over the chips will be stress relieved by the low modulus of the filler/encapsulant. This tends to relieve stress due to thermal expansion between the module and the circuit board to which it will be ultimately attached. This gives a stress relieving effect without any additional stress relief layers. As an exemplary filler/encapsulant, a silicone such as 96-083 available from Dow Corning of Midland, Mich. may be used. This encapsulant may be filled with a molding compound filler of finely divided spherical silica or alumina to match an expansion coefficient and to improve machining characteristics such as dicing and grinding or lapping. Such fillers are available from Tatsumori of Tokyo, Japan, or from Ristar of Lianyungang, Jiangsu, China.

Figure 7A:
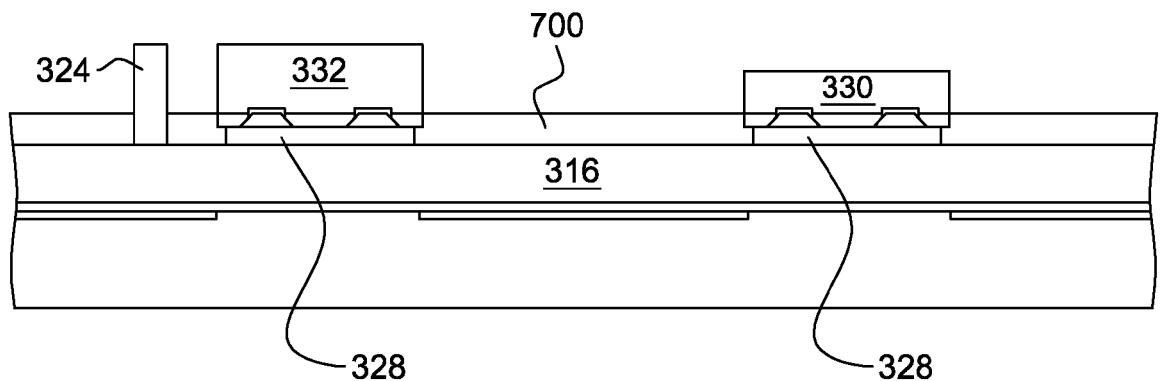
FIG. 7A illustrates an alternative structure produced from the structure of FIG. 3E by the application of a precoat layer, in accordance with an aspect of the present invention.
Figure 7B:
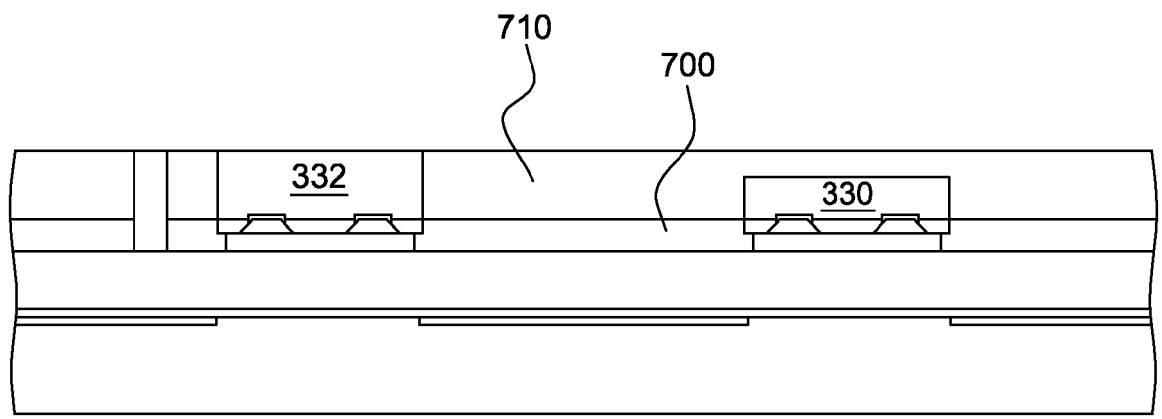
FIG. 7B is a cross-sectional elevational view of the structure of FIG. 7A, after disposition of a structural material filling the space between the chips of the chips-first layer, in accordance with an aspect of the present invention.

In some cases, the filler material in the filler/encapsulant causes the surface in the area over the filler/encapsulant to be rough. This may effect the patterning of the metallization and impact the overall resolution that may be obtained during the patterning. The roughness may be eliminated by adding an additional step. Before the filler/encapsulant is applied a thin precoat layer 700 (FIG. 7A) of unfilled material may be applied. This may be done by spin or spray coating or dispensing with a Cam-A-Lot precision dispenser. After coating, the precoat layer may be partially cured before finishing the other steps outlined above. By only partially curing this precoat layer, it will bond well to the next layer of filler/encapsulant. When the alignment carrier is removed, the top surface is smooth and patterning of the metal can have a very high resolution. The top of the chip is typically covered in a layer that is very smooth so high resolution patterning above the IC chip is also achievable. In another similar variation, the first layer may be a low modulus high elongation material. Such a material is disclosed in U.S. Pat. No. 6,426,545, the entirety of which is hereby incorporated herein by reference. Other materials which are low modulus high elongation, such as silicone or certain high silicone silicone polyimides or silicone epoxies, may also be used. SINR 3170 available from Shin-Etsu MicroSi is a high silicone polyimide and SIB1110.0 or DMS-E11 available from Gelest, Inc. of Morrisville, Pa., are silicone epoxies. There is no requirement that these materials be photo patternable as they are applied and cured without patterning. When such a material is used the resulting metallization is formed on the low modulus high elongation layer and this layer acts to relieve stress due to thermal expansion between the module and the circuit board to which it will be ultimately attached. FIG. 7A shows the step of applying a precoat layer 700 over polyester film 314 (and surrounding adhesive 328, chips 330, 332 and through channels 324), and FIG. 7B shows the resulting module after the application of a second layer of filler/encapsulant 710 by molding or dispensing, and lapping or grinding steps, as disclosed above.

Figure 8A:
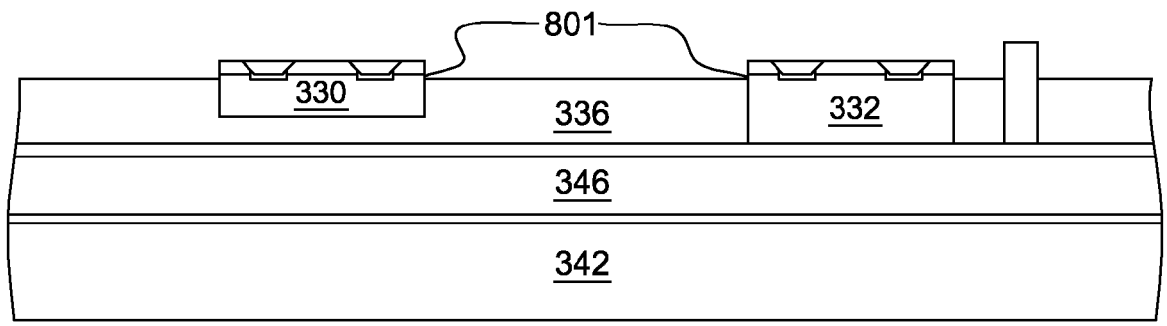
FIG. 8A depicts a further alternate embodiment of an intermediate chips-first structure, wherein the structural material has an upper surface substantially co-planar with or lower than the upper surfaces of the chips of the chips-first layer, in accordance with an aspect of the present invention.
Figure 8B:
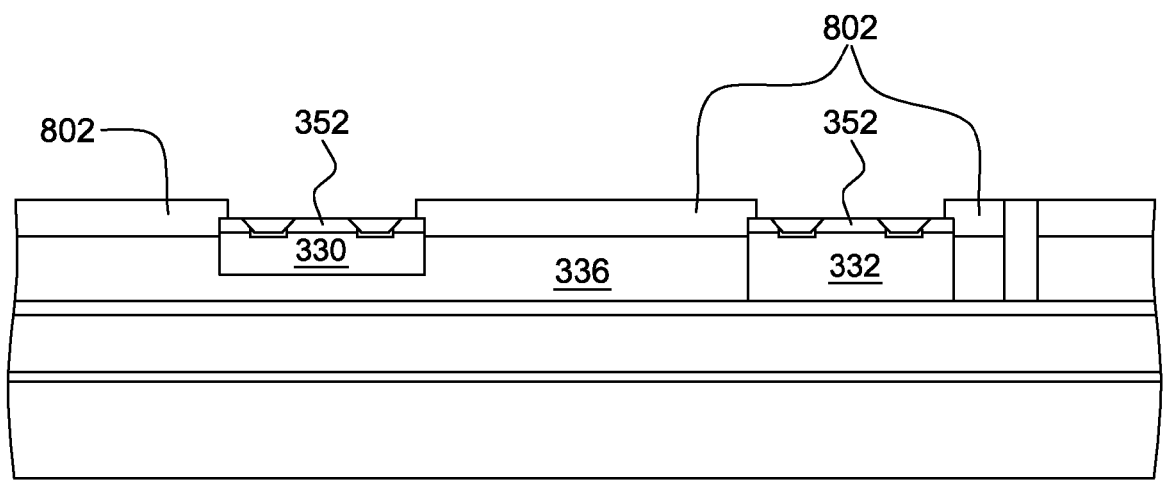
FIG. 8B is a cross-sectional elevational view of the structure of FIG. 8A, after disposition of an edge protect layer over the structural material, including over the pad masks of the chips of the chip layer, to protect the edges thereof, in accordance with an aspect of the present invention.
Figure 8C:
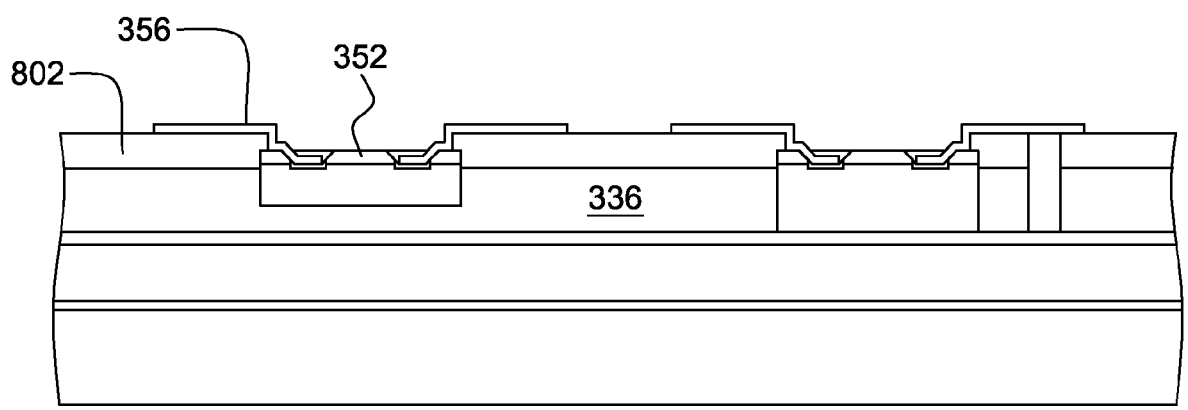
FIG. 8C is a cross-sectional elevational view of the structure of FIG. 8B, after disposition of a metallization layer over the edge protect layer and the pad masks of the chips, producing an alternate embodiment of an electronic module, in accordance with an aspect of the present invention.

Same Structure Using Patterned Dielectric:

In the above description, the filler/encapsulant material has been described as covering and protecting the edges of the chips in the chips-first layer. It should be noted that many of the advantages of the disclosed invention may also be achieved by patterning a thin layer of material that protects the edges of the chips. There are now numerous processes that yield a panel of chips with a filler encapsulant essentially coplanar with the tops of chips and various ways of holding the chips in alignment. However, these processes/structures do not sufficiently protect or insulate the chip edges from metallization (that may be run over the edge of the chips) without the danger of shorting. FIG. 8A shows an exemplary electronic module (as described above), wherein the edges 801 of the chips are unprotected. In such a case, an edge protect layer 802 of dielectric material may be applied and patterned such that the chip edges are protected, as shown in FIG. 8B. This patterning is generally far more easily achieved than patterning individual via holes above each chip pad. In some cases it may be screen printed. In others, a thin layer of photo patternable dielectric may be applied and exposed and photo patterned. Such dielectrics are disclosed in U.S. Pat. No. 5,841,193, which is hereby incorporated herein by reference in its entirety. Further, the dielectric need only protect the edges of the chips and although shown as a contiguous sheet in FIG. 8B it should be understood that strips that protect the chip edges can be effective as well. The resultant electronic module with first level interconnect 356 over edge protect layer 802 and pad masks 352 is illustrated in FIG. 8C.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the spirit of the invention, and these are therefore considered to be within the scope of the invention as defined in the following claims.

What is claimed is:

1. An electronic module comprising:
   a chip layer including:
      at least one chip, each chip comprising at least one side surface, an upper surface, a lower surface, at least one contact pad at the upper surface, and a pad mask over the upper surface with at least one opening therein exposing the at least one contact pad at the upper surface;
      a structural material surrounding and physically contacting the at least one side surface of each chip of the at least one chip of the chip layer, the structural material having an upper surface substantially co-planar with or parallel to an upper surface of the at least one chip and defining at least a portion of a front surface of the chip layer, and a lower surface substantially co-planar with or parallel to a lower surface of the at least one chip and defining at least a portion of a back surface of the chip layer, and wherein the structural material comprises a dielectric material; and
   a metallization layer disposed over the front surface of the chip layer, the metallization layer residing at least partially on and in physical contact with the structural material and at least partially on and in physical contact with the pad mask of the at least one chip, and extending over at least one edge of the at least one chip, and wherein the pad mask of the at least one chip of the chip layer and the structural material of the chip layer electrically isolate the metallization layer from the at least one edge of the at least one chip and from one or more electrical structures of the at least one chip.

2. The electronic module of claim 1, wherein the structural material extends to a height above the pad mask on each chip of the at least one chip of the chip layer.

3. The electronic module of claim 1, wherein the structural material extends over a portion of the at least one pad mask of the at least one chip at the at least one edge thereof, wherein a majority of the pad mask of each chip of the at least one chip of the chip layer is exposed, being uncovered by the structural material.

4. The electronic module of claim 1, wherein the metallization layer comprises a fan-out metallization layer electrically connecting the at least one contact pad of the at least one chip to at least one input/output pad disposed over the structural material.

5. The electronic module of claim 4, wherein the at least one chip comprises multiple contact pads at the upper surface thereof, and wherein the fan-out metallization layer comprises multiple input/output pads disposed over the structural material adjacent to the at least one chip, and wherein the fan-out metallization layer electrically connects a contact pad of the multiple contact pads at the upper surface of the at least one chip to a respective input/output pad of the multiple input/output pads disposed over the structural material.

6. The electronic module of claim 5, further comprising a solder mask disposed over the front surface of the chip layer, including over the metallization layer, and wherein the electronic module further comprises at least one solder input/output bump electrically contacting the at least one input/output pad of the multiple input/output pads disposed over the structural material.

7. The electronic module of claim 1, further comprising at least one dielectric layer disposed over the front surface of the chip layer, including over the metallization layer, and wherein the metallization layer is a first patterned metallization layer, and wherein the electronic module further comprises a second patterned metallization layer disposed over the dielectric layer, the second patterned metallization layer making electrical contact to at least a portion of the first metallization layer.

8. The electronic module of claim 7, wherein the at least one chip comprises multiple contact pads at an upper surface, and the second metallization layer further directly electrically contacts at least one contact pad of the multiple contact pads at the upper surface of the at least one chip.

9. The electronic module of claim 1, wherein at least a portion of the structural material is a low modulus, high elongation dielectric material.

10. The electronic module of claim 9, wherein the low modulus, high elongation dielectric material is selected to relieve anticipated thermal mismatch stress between the electronic module and a circuit board to which the electronic module is configured to be attached.

11. The electronic module of claim 1, wherein an upper portion of the structural material is a precoat layer, the precoat layer comprising at least one of a lower modulus material than the balance of the structural material or a smoother upper surface than the upper surface of the balance of the structural material.

12. An electronic module comprising:
a chip layer including:
at least one chip, each chip comprising at least one side surface, an upper surface, a lower surface, at least one contact pad at the upper surface, and a pad mask over the upper surface with at least one opening therein exposing the at least one contact pad at the upper surface;
a structural material surrounding and physically contacting the at least one side surface of each chip of the at least one chip of the chip layer, the structural material having an upper surface substantially co-planar with or parallel to an upper surface of the at least one chip, and a lower surface substantially co-planar with or parallel to a lower surface of the at least one chip and defining at least a portion of a back surface of the chip layer;
an edge protect layer disposed over at least a portion of the structural material, and defining at least a portion of a front surface of the chip layer, wherein the edge protect layer comprises a dielectric material which extends over a portion of the pad mask of the at least one chip at at least one edge thereof, and wherein a majority of the pad mask of the at least one chip of the chip layer is exposed, being uncovered by the edge protect layer; and
a metallization layer disposed over the front surface of the chip layer, the metallization layer residing at least partially on and in physical contact with the pad mask of the at least one chip, extending over the at least one edge of the at least one chip, and residing at least partially on and in physical contact with the edge protect layer, and wherein the edge protect layer, the structural material, and the pad mask electrically isolate the at least one edge of the at least one chip, and one or more electrical structures of the at least one chip, from the metallization layer.

13. The electronic module of claim 12, wherein the at least one chip comprises multiple contact pads at the upper surface thereof, and wherein the metallization layer comprises a fan-out metallization layer comprising multiple input/output pads disposed over the edge protect layer adjacent to the at least one chip, and wherein the fan-out metallization layer electrically connects a contact pad of the multiple contact pads at the upper surface of the at least one chip to a respective input/output pad of the multiple input/output pads disposed over the edge protect layer.

14. The electronic module of claim 13, further comprising a solder mask disposed over the front surface of the chip layer, including over the metallization layer, and wherein the electronic module further comprises multiple solder input/output bumps electrically contacting the multiple input/output pads disposed over the edge protect layer.

15. The electronic module of claim 13, further comprising at least one dielectric layer disposed over the front surface of the chip layer, including over the metallization layer, wherein the metallization layer resides between the edge protect layer and the at least one dielectric layer, and wherein the metallization layer is a first patterned metallization layer, and the electronic module further comprises a second patterned metallization layer disposed over the dielectric layer, the second patterned metallization layer making electrical contact to at least a portion of the first patterned metallization layer.

16. The electronic module of claim 15, wherein the at least one chip comprises multiple contact pads at the upper surface, and the second patterned metallization layer further directly electrically contacts at least one contact pad of the multiple contact pads at the upper surface of the at least one chip.

17. The electronic module of claim 12, wherein at least a portion of the structural material is a low modulus, high elongation dielectric material.

18. The electronic module of claim 17, wherein the low modulus, high elongation dielectric material is selected to relieve anticipated thermal mismatch stress between the electronic module and a circuit board to which the electronic module is configured to be attached.

19. A circuit structure comprising:
at least one chips-first layer, each chips-first layer comprising:
at least one chip, each chip comprising at least one side surface, an upper surface, a lower surface, and at least one contact pad at the upper surface, and a pad mask over the upper surface with at least one opening therein exposing the at least one contact pad at the upper surface;
at least one electrically conductive structure comprising at least one side surface, an upper surface and a lower surface;
a structural material surrounding the at least one side surface of each chip of the at least one chip of the chips-first layer and surrounding the at least one side surface of each electrically conductive structure of the at least one electrically conductive structure, the structural material having an upper surface substantially coplanar with or parallel to at least one of the upper surface of the at least one chip or the upper surface of the at least one electrically conductive structure, and defining at least a portion of a front surface of the chips-first layer, and a lower surface substantially coplanar with or parallel to at least one of a lower surface of the at least one chip or a lower surface of the at least one electrically conductive structure, and defining at least a portion of a back surface of the chips-first layer, and wherein the structural material comprises a dielectic material; and
a metallization layer at the front surface of the chips-first layer, the metallization layer residing at least partially on and in physical contact with the upper surface of the structural material and at least partially on and in physical contact with the pad mask of the at least one chip, and extending over at least one edge of the at least one chip, and wherein the metallization layer electrically connects the at least one contact pad on the upper surface of the at least one chip to the at least one electrically conductive structure, and the structural material and the pad mask over the upper surface of the at least one chip electrically isolate the metallization layer from the at/least one edge of the at least one chip.

20. The circuit structure of claim 19, further comprising at least one input/output interconnect structure disposed over the front surface of the at least one chips-first layer, the at least one input/output interconnect structure physically and electrically contacting the metallization layer and facilitating electrical connection from the front surface of the at least one chips-first layer to at least one of the at least one chip or the at least one electrically conductive structure of a chips-first layer of the at least one chips-first layer.

21. The circuit structure of claim 19, wherein the structural material of each chips-first layer extends to a height above the pad mask on the at least one chip of the chips-first layer.

22. The circuit structure of claim 19, wherein the structural material of each chips-first layer extends over a portion of the pad mask of the at least one chip at the at least one edge thereof, and wherein a majority of the pad mask of the at least one chip of the chips-first layer is exposed, being uncovered by the structural material.

* * * * *